United States Patent
Wiedemuth et al.

(10) Patent No.: US 7,586,210 B2
(45) Date of Patent: Sep. 8, 2009

(54) POWER DELIVERY CONTROL AND BALANCING BETWEEN MULTIPLE LOADS

(75) Inventors: Peter Wiedemuth, Herbolzheim (DE); Alfred Trusch, Brelsach (DE); Dieter Meier, Brelsach (DE); Gerhard Zaehringer, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 248 days.

(21) Appl. No.: 11/203,433

(22) Filed: Aug. 15, 2005

(65) Prior Publication Data

US 2006/0032738 A1    Feb. 16, 2006

Related U.S. Application Data

(63) Continuation of application No. PCT/EP2004/001293, filed on Feb. 12, 2004.

(30) Foreign Application Priority Data

Feb. 15, 2003    (DE) ................ 103 06 347

(51) Int. Cl.
   *H02J 3/14*    (2006.01)
(52) U.S. Cl. ........................................ 307/31
(58) Field of Classification Search ............. 363/17, 363/39; 307/31; 361/233, 234; 118/728; 156/345.28; 315/111.21, 224; 204/298.08, 204/192.12; 427/8; 219/661
   See application file for complete search history.

(56) References Cited

U.S. PATENT DOCUMENTS

| | | | | |
|---|---|---|---|---|
| 5,066,894 A | * | 11/1991 | Klier | ............... 315/224 |
| 5,169,509 A | | 12/1992 | Latz et al. | |
| 5,303,139 A | | 4/1994 | Mark | |
| 5,463,287 A | * | 10/1995 | Kurihara et al. | ............. 315/307 |
| 5,586,017 A | | 12/1996 | Rohrbeck et al. | |
| 5,608,294 A | * | 3/1997 | Derra et al. | ................. 315/224 |
| 5,807,470 A | | 9/1998 | Szczyrbowski et al. | |
| 5,910,886 A | * | 6/1999 | Coleman | ..................... 363/17 |
| 5,936,359 A | * | 8/1999 | Gibson | ........................ 315/276 |
| 6,011,704 A | * | 1/2000 | Coleman | ..................... 363/37 |

(Continued)

FOREIGN PATENT DOCUMENTS

DE    41 27 505    2/1993

(Continued)

OTHER PUBLICATIONS

International Search Report (Application No. PCT/EP2004/001293) (abstract), 9 pages.

(Continued)

*Primary Examiner*—Albert W Paladini
*Assistant Examiner*—Daniel Cavallari
(74) *Attorney, Agent, or Firm*—Fish & Richardson P.C.

(57) ABSTRACT

A plasma process machine includes at least two electrodes disposed in a processing chamber and in contact with targets, an alternating current source connected to supply power to the electrodes, and a power delivery controller adapted to control power delivered by the alternating current source to the electrodes. The power delivery controller is configured to determine a control value from a comparison between actual power delivery as detected by a detector and a desired power delivery, and to adjust power delivery based on the control value.

21 Claims, 4 Drawing Sheets

U.S. PATENT DOCUMENTS

| | | | |
|---|---|---|---|
| 6,051,935 A * | 4/2000 | Bucks et al. | 315/224 |
| 6,096,174 A | 8/2000 | Teschner et al. | |
| 6,141,448 A * | 10/2000 | Khansari et al. | 382/236 |
| 6,532,161 B2 | 3/2003 | Kovalevskii et al. | |
| 6,538,393 B2 * | 3/2003 | Buij et al. | 315/224 |
| 6,608,401 B1 * | 8/2003 | Walter | 307/39 |
| 6,730,894 B2 | 5/2004 | Thompson et al. | |
| 6,735,099 B2 * | 5/2004 | Mark | 363/63 |
| 6,777,831 B2 * | 8/2004 | Gutierrez et al. | 307/412 |
| 2001/0005320 A1 * | 6/2001 | Ueda et al. | 363/95 |
| 2001/0031310 A1 | 10/2001 | Saeki | |

FOREIGN PATENT DOCUMENTS

| | | |
|---|---|---|
| DE | 43 24 683 | 11/1994 |
| DE | 43 26 100 | 2/1995 |
| DE | 195 06 515 | 3/1996 |
| DE | 19506515 | 3/1996 |
| DE | 196 05 314 | 8/1997 |
| DE | 19605314 | 8/1997 |
| JP | 48-13296 | 4/1973 |
| JP | 63-290191 | 11/1988 |
| JP | 2-156081 | 6/1990 |
| JP | 2-225662 | 9/1990 |
| JP | 6165385 | 6/1994 |
| JP | 7-78697 | 3/1995 |
| JP | 7078588 | 3/1995 |
| JP | 8-209353 | 8/1996 |
| JP | 2000-295790 | 10/2000 |
| JP | 2001-297896 | 10/2001 |
| WO | WO 95/03682 | 2/1995 |
| WO | WO 0180413 A1 * | 10/2001 |

OTHER PUBLICATIONS

International Preliminary Report on Patentability from corresponding PCT application (PCT/EP2004/001293), Sep. 16, 2005.

Office Action from corresponding Japanese Patent Application No. 2006-501814, dated Dec. 12, 2008, 5 pages, with English translation, 9 pages.

* cited by examiner

POWER DELIVERY CONTROL AND BALANCING BETWEEN MULTIPLE LOADS

CLAIM FOR PRIORITY

The present application is a continuation of International Application No. PCT/EP2004/001293, filed Feb. 12, 2004, which claims priority from German Application No. 103 06 347.1, filed Feb. 15, 2003. The contents of the prior applications are incorporated herein in their entirety by reference.

TECHNICAL FIELD

The invention relates to the delivery of power provided by an alternating current source to multiple loads.

BACKGROUND

In a plasma process, electrical loads designed as electrodes are positioned in a plasma chamber. To stimulate the plasma process, the electrodes are connected to the alternating voltage of a power supply. The electrodes are in contact with so-called targets. The targets consist of a base material on the electrodes e.g., a coating. In a plasma coating process of this type, this base material can be removed from the targets. The targets of such arrangements are usually similar, i.e., they consist of the same material, have substantially the same size and the same construction and are therefore usually supplied with substantially the same power. In the plasma process, the targets are ablated at substantially the same speed. However, slight differences cannot be eliminated. The targets may initially be asymmetrical or become asymmetrical because of ablation during the plasma process. These asymmetries can cause differences in the impedances and burning voltages of the targets. These differences result in different power delivery and different wear periods. This effect can cause one target, which has been worn to a larger extent, to consume more power than other targets, and therefore burn even more quickly. The final result of this effect is that one target is completely burnt while others still have sufficient material. This behavior is highly undesired. Although this problem has been known for a long time, there has been no remedy so far.

It is therefore desirable to provide a method for influencing the power delivery into the electrical loads, and an associated device.

Plasma processes do not always run completely continuously. Impurities, temporally and locally limited charging or other instabilities in the chamber can produce spark-overs in the plasma, so-called arcs, at irregular intervals. These arcs can entail undesired consequences in many cases, such as, e.g., rapid current increase and voltage drops. This can disturb the plasma process, with the consequence of undesired results for target and plasma process. For this purpose, so-called arc management circuits are provided for plasma process power supplies. They stop undesired power delivery in case of such an arc. Upon detection of such an arc, the current supply is generally switched off as quickly as possible or after a defined time period. It is thereby often important to interrupt the power delivery into the plasma process as quickly as possible to protect the power supply, the targets and the objects to be coated.

SUMMARY

Various aspects of the invention feature a method for delivering power from an alternating current source to at least two electrical loads by detecting the actual power delivery to the loads, and then comparing the detected actual power delivery with a given desired power delivery, and adjusting the power delivery when the detected and desired power deliveries differ.

The adjustment is preferably effected by delivering or removing power from/to the alternating current source and at least one of the loads. This process ensures that the power delivery is based on a measurement of the delivered actual power. The disclosed method permits control of the power delivered to the electrodes independently of the type of alternating current source in a plasma process such that it corresponds to a predetermined power delivery. Adjustment may alternatively be effected by changing the control of the alternating current source in such a manner that the actual power delivery equals the desired power delivery.

In a plasma process, each connection of the alternating voltage source can be connected to at least one electrode. In this case, the electrodes are the electrical loads to which the power is delivered.

By "alternating current source" we mean a power source having an alternating voltage and an alternating current at its output. It may be a power source with current source or voltage source characteristics or other characteristics, and the voltage and current may be of any form and even contain a DC portion. In particular, we mean to include alternating current sources that provide at their outputs only AC portions and no DC portions, due to galvanic isolation. Control of the alternating current source can be utilized also for such alternating current sources without DC portions to adjust the actual power delivery to the desired power delivery.

The predetermined desired power delivery may thereby be symmetric or asymmetric. Depending on whether a symmetric or asymmetric desired power delivery is predetermined, the power delivered by the alternating current source is preferably controlled in such a manner that the actual power delivery to the loads corresponds to the desired power delivery. To ensure that the targets have identical wear times, the predetermined desired power delivery will advantageously be symmetric. In some cases an asymmetric desired power delivery makes sense, e.g., to counteract already effected irregular wear or to ablate targets of different materials or structures in the desired manner.

In a particular embodiment, the actual power delivery is detected by determining power-dependent values for each load, which may be effected in the most different ways. A power-dependent value could, e.g., be the temperature at an electrode or the radiation emitted by the plasma at an electrode. To determine the power-dependent values, the current and voltage at the loads are usually measured.

In a plasma process comprising two electrodes each being connected to a connection of the alternating current source, the average effective power to each electrode corresponds substantially to the current in the direction of the electrode, multiplied by the voltage measured between ground and the electrode.

In an advantageous method variant, the frequency of the alternating current source is between 1 kHz and 1 MHz, in particular, between 50 kHz and 500 kHz.

Another aspect of the invention features a power delivery control unit including a control member and an adjusting member. The control member determines a control value from a comparison between the actual power delivery detected by a detecting device and a given desired power delivery. The adjusting member can be looped in between the alternating current source and at least one electrical load and adjusts the power delivery on the basis of the control value. "Looping in" thereby means that the adjusting member is connected in series with the alternating current source. By inserting the adjusting member into a connecting line between the alternating current source and the electrical load, this device offers versatile application and can also be retro-fitted to existing systems. Several connecting lines can be combined into one multi-conductor connecting line.

Various aspects of the invention can advantageously provide the detection of the actual power delivery to the loads, thereby permitting control of the power delivery. The loads may each be designed as at least one electrode in a plasma process. For an alternating current source with two connections, each electrode may be connected to a respective connection of the alternating current source. It is also possible to connect several electrodes to one connection. The power delivery control unit can thereby influence the wear times of the individual targets connected to the electrodes.

The adjusting member may include a controllable DC voltage source. This is one possibility of influencing the power delivery to the electrodes, which can be realized in a particularly simple manner. Both positive and negative voltages may be set at the direct voltage source, depending on which load is to be delivered with power. The direct voltage source may have any design, e.g., even two direct voltage sources which are connected in opposite polarity and can each individually output only a positive voltage, and are alternately connected depending on the voltage polarity required.

In another embodiment, the adjusting member includes at least one controllable ohmic load. The power delivery is thereby influenced by removing power from at least one of the loads. If, in a plasma process with one electrode being connected to each connection of the alternating current source, the power delivery into the electrode is determined by the current in the direction of the electrode and the voltage of the electrode to ground, the power removal can be controlled by one single, looped-in ohmic load in that the ohmic load is controlled in time with the frequency of the alternating current source to always have a higher ohmic value in one current direction than in the other current direction. This requires complex and precise driving of the ohmic load. In one configuration the driving of ohmic loads is less complex, wherein two ohmic loads are looped-in through diodes which are connected in opposite orientation, such that each ohmic load is associated with a current direction.

In some configurations, the ohmic loads include controllable semi-conductors, such as so-called insulated gate bipolar transistors (IGBTs). With corresponding switching, these elements can generate ohmic loads in a very simple manner, which are controlled by the control value via a driving circuit embodiment.

In another embodiment, the adjusting member includes two impedances which can be inductively controlled and are separated via oppositely-oriented diodes. They, too, are controlled to remove power to adjust the actual power delivery to the desired power delivery.

In yet another embodiment, the adjusting member includes a transformer whose primary winding can be looped-in in a connecting line between alternating current source and load, and at whose secondary winding is provided a switching device with semi-conductor components which can be adjusted by the control value. These are also controlled in such a manner that power is removed to adjust the actual power delivery to the desired power delivery.

Further embodiments of the adjusting member for delivering and removing power are feasible, as well as a combination of the above-mentioned embodiments for, e.g., delivering and also removing power.

In a further embodiment, the detecting device is designed as a measuring device for power-dependent values, which can be effected in different ways. One possible measuring device consists of means for measuring the voltage at each electrical load, such as the voltage from load to ground, a further means for measuring the current into the loads, and a multiplying member that determines the power for each load from the measured voltage and the measured current. There are other ways to determine a power-dependent value, such as by providing a temperature measuring device on each load.

Another aspect of the invention features a power supply comprising a power delivery control unit and alternating current source as described above. When the alternating current source and power delivery control unit are combined in one unit, the same current and voltage measuring means can be utilized to control the alternating current source and also for the power delivery unit.

In one embodiment, the alternating current source includes an output transformer at the output of which an alternating voltage is present that is galvanically isolated from ground with regard to power, has only an AC portion and no DC portion, and is connected to the loads via connecting leads. The arrangement including the output transformer is advantageous in that the alternating voltages can be adjusted at the output of the power supply through changing the winding number of the output transformer to the requirements of the loads. Identical power supplies can be provided for different application ranges except for the output transformers. The output transformers can have a very similar design. "Galvanically isolated from ground with regard to power" means that the ground of the alternating current source and the alternating voltage have no galvanic connection outside of the plasma chamber via which a considerable amount of the power flows. A "galvanic isolation from ground with regard to power" is obtained even if a high-ohmic connection between alternating voltage at the output of the power supply to ground is provided, e.g., for voltage measurement or discharge of charges from the electrodes, or if there is a conducting connection between electrodes and ground within the plasma chamber. Various aspects of the invention offer now the possibility to control the power delivery to the loads even for existing power supplies that previously provided no possibility to divide the power onto the electrodes.

In a further development, the power supply has an oscillating circuit on the primary side of the output transformer, which is usually operated close to resonance, a so-called resonant circuit. Alternating current sources of this type have an excellent efficiency. Primary inductances from the output transformer can be utilized as inductances for this resonant circuit.

In one embodiment, the power supply includes an arc management circuit that generates a further control value that acts on the adjusting member. The arc management circuit is preferably connected to the adjusting member, and the power is always removed via the adjusting member in case of an arc if the management circuit stops the power delivery to the electrodes. The control value generated by the arc management circuit has priority to the control value generated by the control member.

Another aspect of the invention features a power supply with a control member determining a control value through a comparison of the actual power delivery detected by a detecting device and a given desired power delivery, and an alternating current source driven by a control means. The control means drives the alternating current source on the basis of the control value transmitted by the control member in such a manner that the properties of the alternating current are changed such that the actual power delivery into the loads is equal to the desired power delivery.

The alternating current source may be, e.g., a bridge circuit with a downstream resonant circuit. The bridge circuit is supplied with a DC current. Symmetric driving of the bridge circuit produces a symmetric alternating current and a symmetric AC voltage which can be transmitted, such as via an output transformer. The output transformer may be part of a resonant circuit.

If the bridge circuit is asymmetrically driven, the switching elements of the bridge circuit are driven with an asymmetric pulse-duty factor which can reduce, e.g., the duration of the positive half-wave and extend the duration of the negative half-wave of the AC voltage. If the amplitude of the shortened half-wave is correspondingly larger than that of the extended half-wave, a signal without DC portions is obtained which can be transmitted to the output of the alternating current source via the output transformer. An asymmetrical signal of this type generates asymmetric load distribution to the loads (targets) as shown through measurements on plasma processes. This asymmetry of the load distribution can be controlled through asymmetric control of the alternating current source. The actual power delivery can thereby be adjusted to the desired power delivery for symmetrical and asymmetrical desired power deliveries.

Asymmetrical driving of this type generates large currents in the output transformer which can lead to saturation of the core material in conventional transformers with iron or ferrite cores, as described in U.S. Pat. No. 6,532,161, for example. An air transformer has no iron or ferrite core and therefore cannot saturate. For this reason, an air transformer is preferably used.

Another aspect of the invention features a plasma process machine having at least two electrodes disposed in a processing chamber and in contact with targets; an alternating current source connected to supply power to the electrodes; and a power delivery controller adapted to control power delivered by the alternating current source to the electrodes. The power delivery controller is configured to determine a control value from a comparison between actual power delivery as detected by a detector and a desired power delivery, and to adjust power delivery based on the control value.

Further features and advantages of the invention can be extracted from the following description of embodiments of the invention, the figures of the drawing showing details which are essential to the invention and from the claims. The individual features can be realized either individually or collectively in arbitrary combination in a variant of the invention.

DESCRIPTION OF DRAWINGS

Like reference symbols in the various drawings indicate like elements.

DETAILED DESCRIPTION

Figure 1:
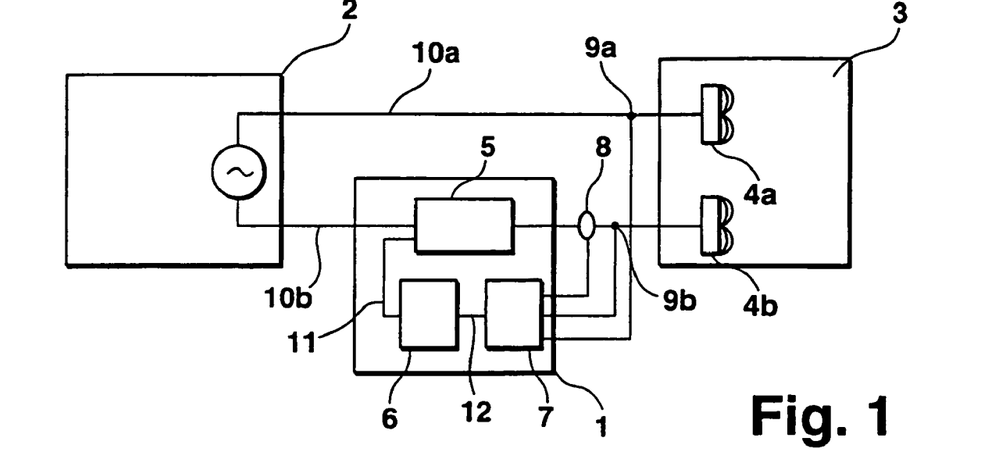
FIG. 1 is a schematic diagram of a power delivery control unit, an alternating current source, and a plasma chamber.

FIG. 1 shows a schematic representation of a power delivery control unit 1 together with an alternating current source 2 and a plasma chamber 3. The alternating current source 2 is connected via two connecting leads 10a and 10b to two electrical loads, which are designed as electrodes 4a and 4b and are positioned in the plasma chamber 3. The power delivery control unit 1 includes three components: an adjusting member 5, a control member 6, and a measured value detecting member 7. The adjusting member 5 is looped-in in the connecting lead 10b. It receives a control value from the control member 6 via the connection 11. The voltage at the nodes 9a and 9b on the connecting leads 10a and 10b is measured and processed into one voltage signal each. An ammeter 8 measures the current in the connecting lead 10b and processes it into a current measuring signal. The measured value detecting member 7, the ammeter 8, and the voltage measurement on the nodes 9a and 9b together form a detecting device for detecting the actual power delivery into the loads. The measured value detecting member 7 detects one power signal each from these measured signals, which corresponds to the effective power delivered to the electrodes 4a and 4b. The power in the electrode 4a consists substantially of the voltage measured on the electrode 4a or on the node 9a, multiplied by the current in the direction of this electrode. The power in the electrode 4b also consists substantially of the voltage measured on the electrode 4b or on the node 9b, multiplied by the current in the direction of this electrode. The current measured by the ammeter 8 can be divided into a positive and a negative portion. The positive portion of the current, multiplied by the voltage measured on the node 9a, shows the effective power delivered to the electrode 4a. The negative portion of the current, multiplied by the voltage measured on the node 9b, gives the effective power delivered to the electrode 4b. One multiplying member therefore calculates one power signal for each electrode from the current measuring signal portions and the voltage measuring signals. The actual power delivery into the electrodes is determined from the two power signals. It is transmitted to the control member 6 via a connection 12. The control member 6 compares the actual power delivery with an internal desired power delivery. If it is symmetrical, the control member 6 adjusts the control value such that both electrodes are delivered with the same power. The adjusting member 5 may deliver or remove power in any current direction. This is explained in more detail below.

Figure 2:
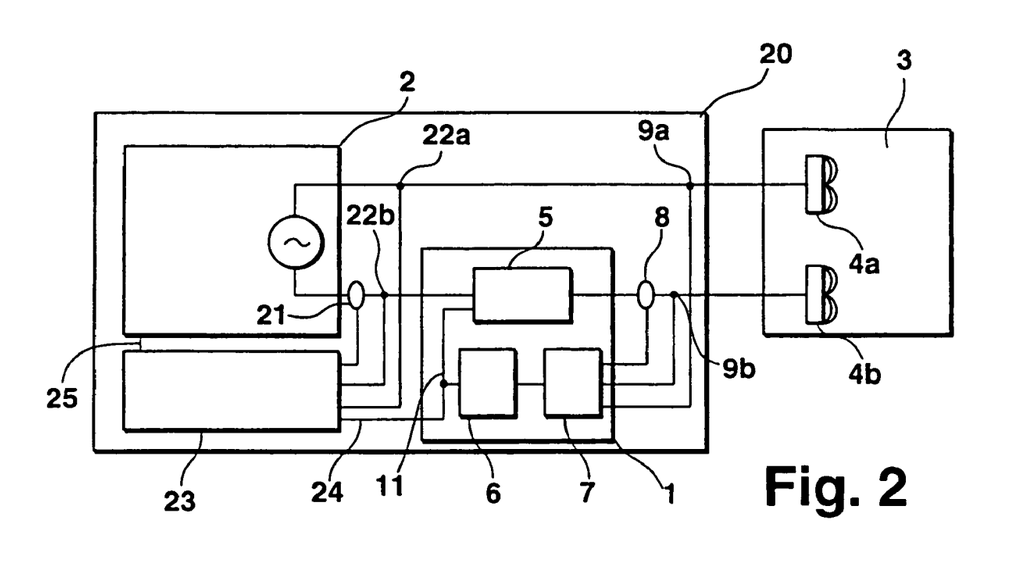
FIG. 2 is a schematic diagram of a power supply that combines an alternating current source, a power delivery control unit and an arc management circuit, and a plasma chamber.

FIG. 2 shows a power supply 20 that includes the alternating voltage source 2 and the power delivery control unit 1 in accordance with FIG. 1, and an additional arc management circuit 23. The arc management circuit 23 determines the current with the ammeter 21 and the voltage at the nodes 22a and 22b, thereby permitting detection of an arc by the arc management circuit 23. The arc management circuit 23 controls the alternating current source 2 via the connection 25 and the adjusting member 5 via the connection 24. In this manner, the remaining power can be removed via the adjusting member 5 if the arc management circuit interrupts the power delivery to the loads (e.g., electrodes 4a and 4b).

Figure 3:
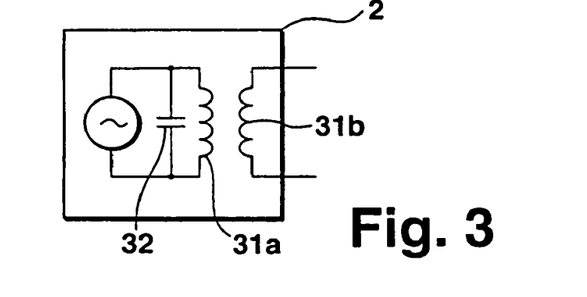
FIG. 3 is a schematic diagram of an alternating current source with an output transformer and a resonant circuit.

FIG. 3 shows a particular embodiment of an alternating current source 2 that can be provided in the control unit 1 or the power supply 20. The alternating current source 2 includes an output transformer with a primary winding 31a and a secondary winding 31b and an oscillating circuit capacitor 32. The alternating voltage of such an alternating current source has no DC portion at its outputs. The capacitance 32 and the primary inductance of the transformer (31a and 31b) together produce an oscillating circuit that is operated close to resonance. With such an alternating current source, the output voltages and output currents can be ideally adjusted to the requirements of the loads by tuning the secondary winding 31b of the transformer. Thus, different loads require only a different transformer, rather than a completely new current supply. The resonant circuit ensures high efficiency of the current supply.

FIGS. 4-7 show examples of the adjusting member 5 shown in FIG. 1. The adjusting member 5 is looped-in in each case in the connecting lead 10b between alternating current source 2 and plasma chamber 3.

Figure 4:
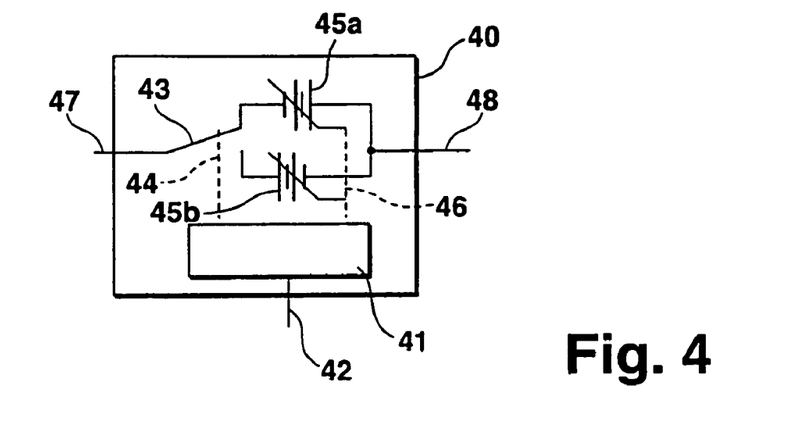
FIG. 4 is a schematic diagram of an adjusting member with controlled direct voltage sources.

In FIG. 4, the adjusting member 40 is looped-in into the connecting lead 10b at the connections 47 and 48 and receives the control value via the connection 42, and converts it into a driving signal 46 in a driving circuit embodiment 41 for two oppositely-directed, adjustable direct current supplies 45a and 45b. A switch 43 is driven by a further driving signal 44 that is also generated by the driving circuit embodiment 41. The switch 43 connects one of direct current supplies 45a and 45b having the desired polarity to deliver power. It is also possible to provide a direct current supply with a device for reversing the polarity or a direct current supply with two output polarities instead of the two switchable direct current supplies.

Figure 5:
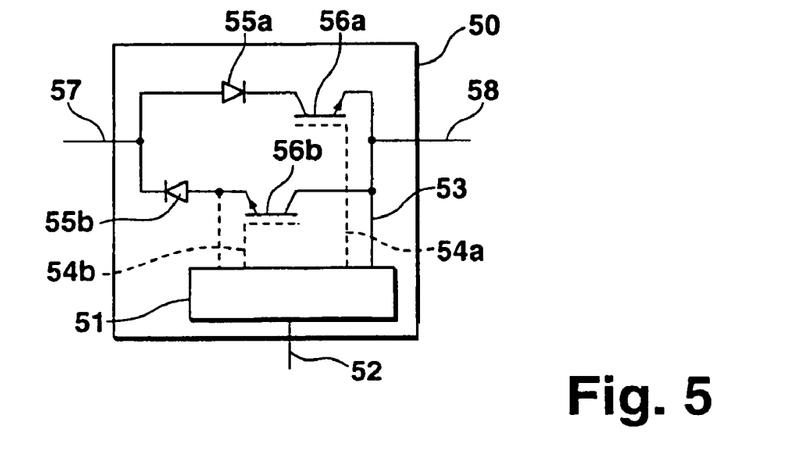
FIG. 5 is a schematic diagram of an adjusting member with two ohmic loads.

In FIG. 5 the adjusting member 50 is looped-in into the connecting lead 10b at the connections 57 and 58. It receives the control value via the connection 52, which it converts into driving signals 54a and 54b for two insulated gate bipolar transistors ("IGBTs") 56a and 56b in a driving circuit embodiment 51. The IGBTs are connected to oppositely-directed diodes 55a and 55b in such a manner that always one IGBT 56a and 56b carries the current for one direction. The IGBTs 56a and 56b are driven in such a manner that they represent ohmic loads in the conducting direction, in this manner permitting independent control of each current direction. Since the power into respectively one of the two electrodes depends directly on the current in the direction of this electrode, independent control of the power in each electrode is possible.

Figure 6:
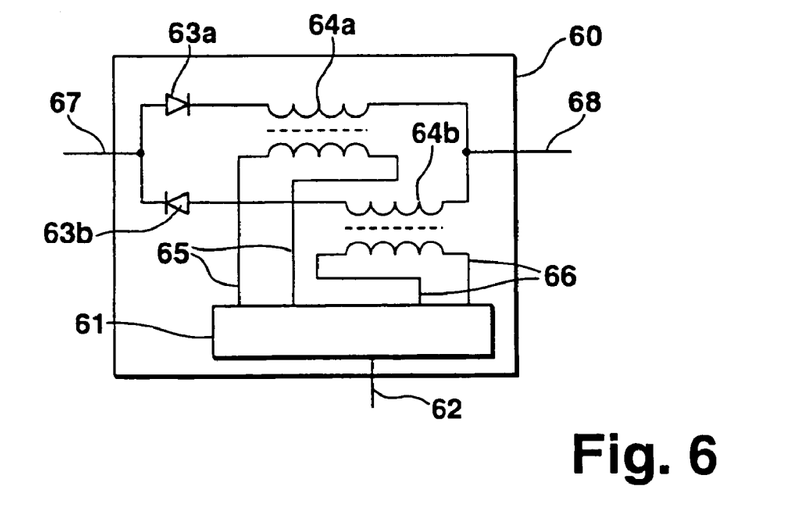
FIG. 6 is a schematic diagram of an adjusting member with two controllable impedances.

In FIG. 6 the adjusting member 60 is looped-in into the connecting lead 10b at connections 67 and 68. It receives the control value via the connection 62 and converts it into driving circuits 65 and 66 in a driving circuit embodiment 61 for two inductively controllable impedances 64a and 64b which are connected to oppositely-directed diodes 63a and 63b in such a manner that always one impedance carries the current for one direction with the consequence that a high direct current portion flows through the impedances. These are designed to operate with this direct current portion in the saturated state and represent only a small resistance to the passing current. The impedances 64a and 64b can be inductively pre-magnetized via the circuits 65 and 66 such that they can be independently desaturated in a controlled manner, thereby representing a higher resistance to the passing current, permitting again separate adjustment of the power delivery for each current direction.

Figure 7:
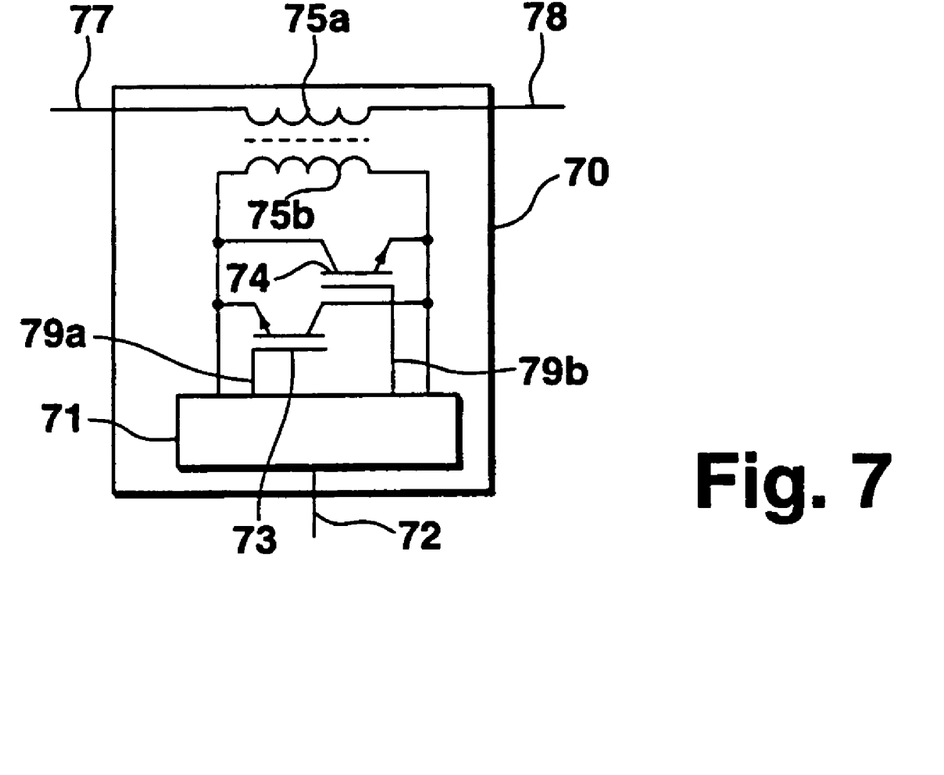
FIG. 7 is a schematic diagram of an adjusting member with a transformer that can be short-circuited on the secondary side.

In FIG. 7, the adjusting member 70 is looped-in into the connecting lead 10b at connections 77 and 78. It receives the control value via the connection 72, which it converts into driving signals 79a and 79b for two oppositely-directed IGBTs 73 and 74 in a driving circuit embodiment 71. A transformer with a primary winding 75a is connected between the connections 77 and 78. The secondary winding 75b is short-circuited by the IGBTs 73, 74 in the normal case. Depending on the current direction in which the power is removed, either the IGBT 73 is brought into a high-ohmic state via the driving signal 79a or the IGBT 74 is brought into a high-ohmic state via the driving signal 79b. This permits again separate adjustment of the power delivery for each current direction.

Figure 8:
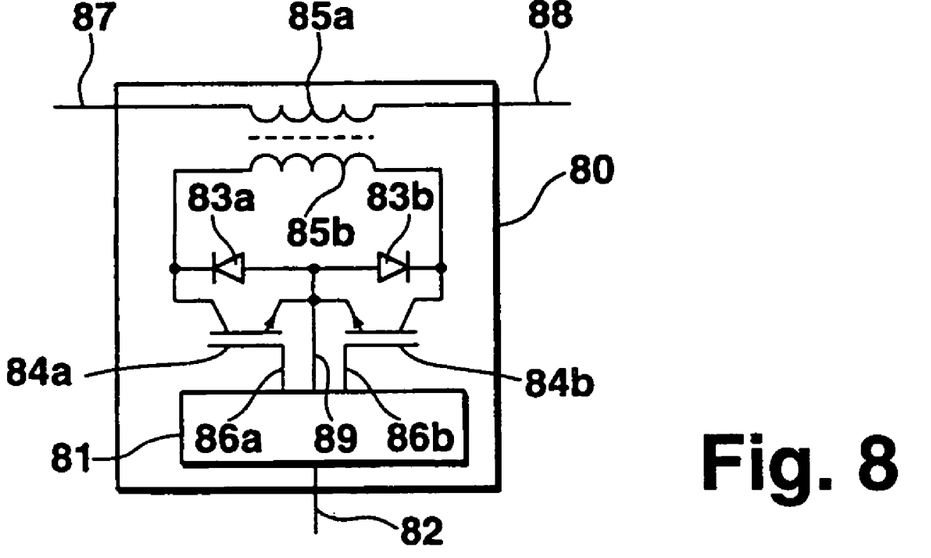
FIG. 8 is a schematic diagram of an adjusting member with a transformer that can also be short-circuited on the secondary side.

In FIG. 8, the adjusting member 80 is looped-in into the connecting lead 10b at the connections 87 and 88. It receives the control value via the connection 82, which it converts into driving signals 86a or 86b in a driving circuit 81 for two IGBTs 84a and 84b connected at a network node 89. A transformer with a primary winding 85a is connected between the connections 87 and 88. The secondary winding 85b is short-circuited in the normal case in a similar manner as in FIG. 7. In this case, the current flows additionally via the diodes 83a and 83b, which may be parasitic diodes in the IGBTs 84a and 84b or external diodes. The IGBTs 84a and 84b can be brought into a high-ohmic state individually and independently of each other through the driving signals 86a and 86b, which permits separate adjustment of the power delivery for each current direction.

Figure 9:
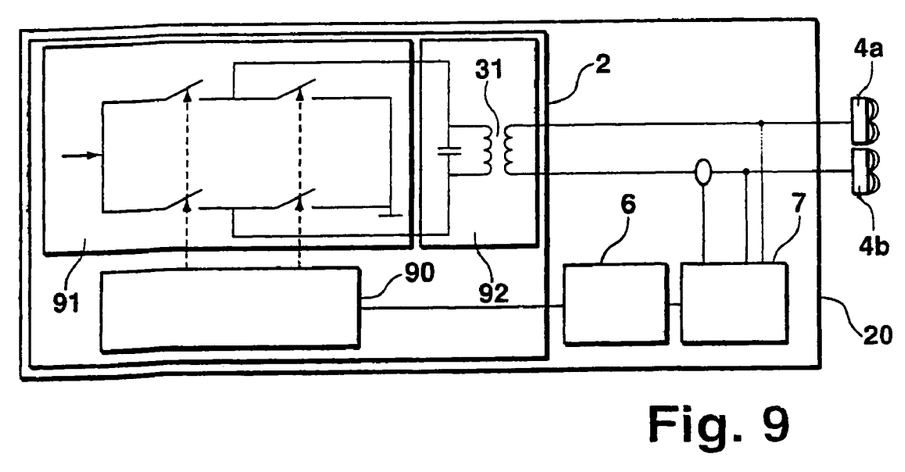
FIG. 9 is a schematic diagram of a power supply with an alternating current source that can be driven.

FIG. 9 shows a power supply 20 that includes the alternating current source 2 that is supplied with a direct current, a control member 6 and a measured value detecting member 7. The control member 6 is connected to a control means 90 that controls the bridge circuit 91. A resonant circuit 92 is connected to the bridge circuit 91, wherein the output transformer 31 represents part of the resonant circuit 92. The power-dependent actual values detected in the measured value detecting member 7, which is part of a detecting device, are compared in the control member 6 with the desired values. The control member 6 determines therefrom a control value that is passed on to the control means 90. The control means 90 controls the switching on and off times, i.e., the pulse-duty factor, of the individual switches of the bridge circuit 91 in such a manner that the detected actual power values are identical to the given desired values. The resonant circuit 92 forms the output voltage of the bridge circuit 91 into a signal which is similar to a sinusoidal shape, but which may be asymmetrical. No DC portions are transmitted by the transformer 31. The power delivery into the loads 4a and 4b may nevertheless be different and be adjusted through driving of the switches of the bridge circuit 91 with a certain pulse-duty factor predetermined by the control means. The pulse-duty factor may be different and asymmetrical for each switch or switch pair, i.e., the switching on and off times may have different lengths. The actual power delivery into the loads can thereby be adjusted to the predetermined desired power delivery.

A number of implementations have been described. Nevertheless, it will be understood that various modifications may be made. Accordingly, other embodiments are within the scope of the following claims.

What is claimed is:

1. A method of controlling the power delivered by a power source to at least two electrical loads, the method comprising:
   connecting a power supply to at least two electrical loads, the power supply comprising:
   an alternating current source having a bridge circuit including switching elements; and a power delivery control unit adapted to control the power delivered by the alternating current source into the electrical loads, the power delivery control unit comprising:
- a control member that determines a control value from a comparison between actual power delivery as detected by a detector and a desired power delivery; and
- an adjusting member inserted between the switching elements of the alternating current source and at least one of the loads such that the adjusting member is in series with the alternating current source and the at least one of the loads to thereby adjust power delivery based on the control value;

driving a bridge circuit having switching elements and being contained in the alternating current source to produce an alternating current voltage and to control an alternating current power output from the alternating current source to provide two alternating current connections;

connecting each connection of the alternating current source to an electrical load to deliver an alternating current to each of the electrical loads;

determining an actual alternating current power delivered to each of the loads;

comparing each of the determined actual powers with a desired power; and based on the comparison, adjusting an amount of power delivered to each of the loads.

2. The method of claim 1, wherein the power delivered to the loads is adjusted for each load by delivering or removing power between the alternating current source and at least one load.

3. The method of claim 1, wherein the desired power is the same for each electrical load.

4. The method of claim 1, wherein the desired power is different for each electrical load.

5. The method of claim 1, wherein the actual power delivery is detected by determining power-dependent values for each load.

6. The method of claim 5, wherein the frequency is between about 50 kHz and 500 kHz.

7. The method of claim 1, wherein the alternating current source generates an alternating current of a frequency of between about 1 kHz and 1 MHz.

8. The method of claim 1, further comprising driving switches of the bridge circuit with an asymmetric pulse-duty factor.

9. The method of claim 1, wherein the loads comprise electrodes of a plasma processing device, and wherein adjusting an amount of power delivered to each of the loads comprises adjusting power delivery to each of the electrodes.

10. A power supply comprising:

an alternating current source having a bridge circuit including switching elements; and a power delivery control unit adapted to control the power delivered by the alternating current source into at least two electrical loads, the power delivery control unit comprising:

a control member that determines a control value from a comparison between actual power delivery as detected by a detector and a desired power delivery; and an adjusting member inserted between the switching elements of the alternating current source and at least one load such that the adjusting member is in series with the alternating current source and the at least one load to thereby adjust power delivery based on the control value.

11. The power supply of claim 10, wherein the alternating current source comprises an output transformer at the output of which an alternating voltage is present, which is galvanically isolated from ground with respect to power and consists only of an alternating portion.

12. The power supply of claim 11, wherein the output transformer has a resonant circuit on its primary side.

13. The power supply of claim 10, further comprising an arc management circuit that generates a further control value to which the adjusting member is responsive.

14. The power supply of claim 10, wherein the adjusting member comprises at least one controllable DC voltage source.

15. The power supply of claim 10, wherein the adjusting member comprises at least one controllable ohmic load.

16. The power supply of claim 15, wherein the adjusting member comprises two controllable ohmic loads, separated via oppositely-directed diodes.

17. The power supply of claim 15, wherein the ohmic loads comprise controllable semi-conductors.

18. The power supply of claim 10, wherein the adjusting member comprises two impedances that are inductively controllable and separated via oppositely-directed diodes.

19. The power supply of claim 10, wherein the adjusting member comprises a transformer whose primary winding is adapted to be inserted in a connecting lead between the alternating current source and one of the loads, and at whose secondary winding is provided a switching device controlled by driving signals generated from the control value by a driving circuit.

20. The power supply of claim 10, wherein the detector comprises a measuring device for power-dependent values.

21. The power supply of claim 10, wherein the control member determines the control value from a comparison between an actual power delivered to each of the electrical loads and a desired power delivery.

* * * * *

UNITED STATES PATENT AND TRADEMARK OFFICE
CERTIFICATE OF CORRECTION

PATENT NO.        : 7,586,210 B2
APPLICATION NO.   : 11/203433
DATED             : September 8, 2009
INVENTOR(S)       : Peter Wiedemuth et al.

It is certified that error appears in the above-identified patent and that said Letters Patent is hereby corrected as shown below:

On the title page item [75] Inventors, delete "Alfred Trusch, Brelsach (DE)" and insert --Alfred Trusch, Breisach (DE)--; please delete "Dieter Meier, Brelsach (DE)" and insert --Dieter Meier, Breisach (DE)--.

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,586,210 B2  Page 1 of 1
APPLICATION NO. : 11/203433
DATED : September 8, 2009
INVENTOR(S) : Wiedemuth et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 87 days.

Signed and Sealed this

Fourteenth Day of September, 2010

David J. Kappos
*Director of the United States Patent and Trademark Office*